(12) United States Patent
Lu et al.

(10) Patent No.: US 10,347,821 B2
(45) Date of Patent: Jul. 9, 2019

(54) ELECTRODE STRUCTURE FOR RESISTIVE MEMORY DEVICE

(71) Applicant: QUALCOMM Incorporated, San Diego, CA (US)

(72) Inventors: Yu Lu, Hangzhou (CN); Junjing Bao, San Diego, CA (US); Xia Li, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/819,993

(22) Filed: Nov. 21, 2017

(65) Prior Publication Data

US 2018/0102472 A1 Apr. 12, 2018

Related U.S. Application Data

(62) Division of application No. 14/630,438, filed on Feb. 24, 2015, now Pat. No. 9,865,798.

(51) Int. Cl.
| | |
|---|---|
| *H01L 43/02* | (2006.01) |
| *H01L 23/544* | (2006.01) |
| *H01L 43/08* | (2006.01) |
| *H01L 43/12* | (2006.01) |
| *G11C 11/16* | (2006.01) |

(52) U.S. Cl.
CPC ............ *H01L 43/02* (2013.01); *H01L 23/544* (2013.01); *H01L 43/08* (2013.01); *H01L 43/12* (2013.01); *G11C 11/16* (2013.01); *H01L 2223/54426* (2013.01); *H01L 2223/54453* (2013.01)

(58) Field of Classification Search
None
See application file for complete search history.

(56) References Cited

U.S. PATENT DOCUMENTS

| | | | |
|---|---|---|---|
| 7,087,972 B1 | 8/2006 | Ren et al. | |
| 7,671,355 B2 | 3/2010 | Kuo et al. | |
| 7,923,714 B2 | 4/2011 | Hsu | |
| 8,183,551 B2 | 5/2012 | Kordus, II et al. | |
| 8,278,215 B2 | 10/2012 | Sun et al. | |

(Continued)

FOREIGN PATENT DOCUMENTS

| | | |
|---|---|---|
| JP | 2005142252 A | 6/2005 |
| JP | 2012164704 A | 8/2012 |

OTHER PUBLICATIONS

International Search Report and Written Opinion—PCT/US2016/015790—ISA/EPO—dated Apr. 14, 2016.

*Primary Examiner* — Khaja Ahmad
(74) *Attorney, Agent, or Firm* — Qualcomm Incorporated Toler

(57) ABSTRACT

A method includes patterning a photo resist layer on top of a semiconductor device. The semiconductor device includes a lower portion, a capping layer formed on top of the lower portion, and an optional oxide layer formed on top of the capping layer. The lower portion includes a dielectric material and an interconnect. The method also includes etching portions of the semiconductor device based on the photo resist layer to expose the interconnect. The method further includes depositing a bottom electrode of a resistive memory device on the interconnect. The bottom electrode is comprised of cobalt tungsten phosphorus (CoWP).

30 Claims, 9 Drawing Sheets

(56) References Cited

U.S. PATENT DOCUMENTS

| | | |
|---|---|---|
| 8,278,763 B2 | 10/2012 | Tada et al. |
| 8,431,923 B2 | 4/2013 | Goswami |
| 8,492,266 B2 | 7/2013 | Ueki et al. |
| 8,546,151 B2 | 10/2013 | Furuta et al. |
| 8,750,019 B2 | 6/2014 | Lu |
| 8,759,212 B2 | 6/2014 | Kume et al. |
| 8,790,935 B1 | 7/2014 | Nagel et al. |
| 9,171,782 B2 | 10/2015 | Hau-Riege et al. |
| 2003/0224260 A1 | 12/2003 | Ning |
| 2003/0235658 A1 | 12/2003 | Shacham-Diamand et al. |
| 2005/0151266 A1 | 7/2005 | Yoshizawa et al. |
| 2005/0181226 A1 | 8/2005 | Weidman et al. |
| 2006/0022286 A1 | 2/2006 | Leuschner et al. |
| 2006/0170068 A1* | 8/2006 | Ren .................. H01L 43/12 257/421 |
| 2006/0276034 A1 | 12/2006 | Blanchard |
| 2007/0080426 A1* | 4/2007 | Matz ................ H01L 23/5223 257/516 |
| 2007/0120210 A1 | 5/2007 | Yuan et al. |
| 2007/0184652 A1* | 8/2007 | Frank ................ H01L 21/288 438/648 |
| 2008/0251926 A1 | 10/2008 | Tada et al. |
| 2008/0284006 A1 | 11/2008 | Hong et al. |
| 2009/0039474 A1 | 2/2009 | Tada et al. |
| 2009/0130779 A1 | 5/2009 | Li |
| 2009/0267198 A1 | 10/2009 | Tada et al. |
| 2010/0109106 A1 | 5/2010 | Zhong et al. |
| 2010/0219512 A1 | 9/2010 | Tada et al. |
| 2010/0289098 A1 | 11/2010 | Li et al. |
| 2011/0089511 A1 | 4/2011 | Keshtbod et al. |
| 2011/0101431 A1 | 5/2011 | Takeuchi et al. |
| 2011/0121417 A1* | 5/2011 | Li ........................ H01L 43/12 257/421 |
| 2011/0159609 A1 | 6/2011 | Iba |
| 2011/0165728 A1 | 7/2011 | Greeley et al. |
| 2011/0201212 A1 | 8/2011 | Yamamoto et al. |
| 2011/0260271 A1 | 10/2011 | Fukui |
| 2012/0043630 A1 | 2/2012 | Omori et al. |
| 2012/0068282 A1 | 3/2012 | Matsuoka et al. |
| 2012/0115292 A1 | 5/2012 | Smith et al. |
| 2013/0032775 A1 | 2/2013 | Satoh et al. |
| 2013/0092895 A1* | 4/2013 | Tada .................. H01L 45/085 257/5 |
| 2013/0175494 A1 | 7/2013 | Collins et al. |
| 2013/0207066 A1 | 8/2013 | Vereen et al. |
| 2013/0299952 A1 | 11/2013 | Yamamoto et al. |
| 2014/0124881 A1 | 5/2014 | Kwon et al. |
| 2015/0108602 A1 | 4/2015 | Choi et al. |
| 2015/0171314 A1 | 6/2015 | Li et al. |
| 2015/0236091 A1 | 8/2015 | Yamamoto et al. |
| 2015/0249209 A1 | 9/2015 | Lu et al. |
| 2015/0325622 A1* | 11/2015 | Zhang ................ H01L 43/12 257/421 |
| 2016/0027726 A1 | 1/2016 | Zhu et al. |
| 2016/0093668 A1 | 3/2016 | Lu et al. |
| 2016/0093670 A1* | 3/2016 | Jiang ................ H01L 27/222 257/421 |
| 2016/0248002 A1 | 8/2016 | Lu et al. |

* cited by examiner

ELECTRODE STRUCTURE FOR RESISTIVE MEMORY DEVICE

I. CROSS-REFERENCE TO RELATED APPLICATIONS

The present application claims priority from and is a divisional application of U.S. Non-Provisional patent application Ser. No. 14/630,438, filed Feb. 24, 2015 and entitled "ELECTRODE STRUCTURE FOR RESISTIVE MEMORY DEVICE," the contents of which are incorporated herein by reference in their entirety.

II. FIELD

The present disclosure is generally related to a resistive memory device.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), tablet computers, and paging devices that are small, lightweight, and easily carried by users. Many such computing devices include other devices that are incorporated therein. For example, a wireless telephone can also include a digital still camera, a digital video camera, a digital recorder, and an audio file player. Also, such computing devices can process executable instructions, including software applications, such as a web browser application that can be used to access the Internet and multimedia applications that utilize a still or video camera and provide multimedia playback functionality.

A wireless device may include resistive memory devices to store data. For example, a wireless device may include a magnetic random access memory (MRAM) that is operable to store data and/or a resistive random access memory (RRAM) that is operable to store data. For MRAM technologies, a resistance of a magnetic tunnel junction (MTJ) device may indicate the logic state of a particular bit cell. The MTJ device may be integrated with interconnect levels (e.g., copper layers in a semiconductor device), and a bottom electrode structure may separate the MTJ device from an interconnect level (e.g., a copper layer). The bottom electrode may function to protect the MTJ device from degradation. Forming the MTJ device may include patterning steps, etching steps, and film growth conditions that may degrade the interconnect level (e.g., copper).

Typically, the thickness of the bottom electrode may be relatively large compared to the size of the MTJ structure. The relatively large thickness of the bottom electrode may protect the interconnect level from patterning steps, etching steps, and film growth during formation of the MTJ device. However, as technological advances create technology nodes smaller in size (e.g., using sub-14 nanometer (nm) processes and below), the challenge becomes to fit the bottom electrode in the shrinking space of these technology nodes.

Typically, the MTJ stack material is deposited on a flat wafer surface. This leads to the challenge of aligning to existing patterns on the wafer after the metallic and opaque MTJ stack is deposited. Commonly known arts to achieve lithography alignment may include etching certain alignment mark topography and removing part or all of the MTJ stack over the pre-existing alignment mark. Both of these methods require an additional lithography mask level and additional etching steps, which add fabrication cost and degrade yield.

IV. SUMMARY

Techniques for forming a shallow bottom electrode structure for a resistive memory device are disclosed. For example, to support sub-14 nm processes, the bottom electrode may be relatively thin (e.g., approximately 10-20 nm) compared to conventional bottom electrodes having a thickness of 50 nm or higher. A semiconductor device may include multiple interconnects (e.g., copper portions) that are separated by dielectrics. For example, the interconnects may correspond to a fifth metal layer (M5) or a sixth metal layer (M6). A capping layer may be deposited on top of the dielectrics and on top of the interconnects, and a thin oxide layer may be deposited on top of the capping layer.

A photo resist may be deposited over the semiconductor device, and a photolithography process may be applied to clear the photo resist material over select portions of the semiconductor device. The select portions of the semiconductor device may include areas under the resistive memory (MRAM or RRAM) devices and the alignment marks. After patterning the photo resist, an etching process may be performed to expose the interconnects. The photo resist may be removed after the etching process is performed. Bottom electrodes may be formed on top of the exposed interconnects using electroless deposition. The bottom electrodes may be comprised of cobalt tungsten phosphorus (CoWP). The relatively thin bottom electrodes (e.g., between approximately 10-20 nm) may be used for sub-14 nm processes, as determined largely by the deposition time. By optimizing the electrochemistry of the electroless deposition process, the CoWP deposition may occur over the exposed metal surface. Additional layers may be deposited and additional process steps may be applied as necessitated by the MTJ or RRAM device deposition requirements. After the bottom electrode is formed, the resistive memory device (e.g., a MRAM device or an RRAM device) may be formed on top of the bottom electrode.

In a particular aspect, a semiconductor device includes an interconnect layer and a bottom electrode of a resistive memory device. The bottom electrode is coupled to the interconnect layer, and the bottom electrode is comprised of cobalt tungsten phosphorus (CoWP).

In another particular aspect, a method includes patterning a photo resist on top of a semiconductor device. The semiconductor device includes a lower portion, a capping layer formed on top of the lower portion, and an optional oxide layer formed on top of the capping layer. The lower portion includes a dielectric layer and an interconnect layer. The method also includes etching portions of the semiconductor device based on the photo resist layer to expose the interconnect layer. The method further includes depositing a bottom electrode of a resistive memory device on the interconnect layer. The bottom electrode is comprised of cobalt tungsten phosphorus (CoWP).

In another particular aspect, a non-transitory computer-readable medium includes instructions that, when executed by a processor, cause the processor to initiate patterning a photo resist on top of a semiconductor device. The semiconductor device includes a lower portion, a capping layer formed on top of the lower portion, and an oxide layer formed on top of the capping layer. The lower portion includes a dielectric layer and an interconnect layer. The instructions are also executable to cause the processor to initiate etching of portions of the semiconductor device based on the photo resist layer to expose the interconnect layer. The instructions are further executable to cause the processor to initiate deposition of a bottom electrode of a resistive memory device on the interconnect layer. The bottom electrode is comprised of cobalt tungsten phosphorus (CoWP).

In another particular aspect, an apparatus includes means for patterning a photo resist on top of a semiconductor device. The semiconductor device includes a lower portion, a capping layer formed on top of the lower portion, and an oxide layer formed on top of the capping layer. The lower portion includes a dielectric layer and an interconnect layer. The apparatus also includes means for etching portions of the semiconductor device based on the photo resist layer to expose the interconnect layer. The apparatus further includes means for depositing a bottom electrode of a resistive memory device on the interconnect layer. The bottom electrode is comprised of cobalt tungsten phosphorus (CoWP).

One particular advantage provided by at least one of the disclosed embodiments is formation of a relatively thin bottom electrode for resistive memory devices to support sub-14 nm processes. The bottom electrode may protect an interconnect layer from degradation caused by formation of components of the resistive memory devices (e.g., MTJ devices) during patterning steps, etching steps, and film growth. Another particular advantage provided by at least one of the disclosed embodiments is the elimination of an additional mask level and associated processing steps to form surface topology alignment marks. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
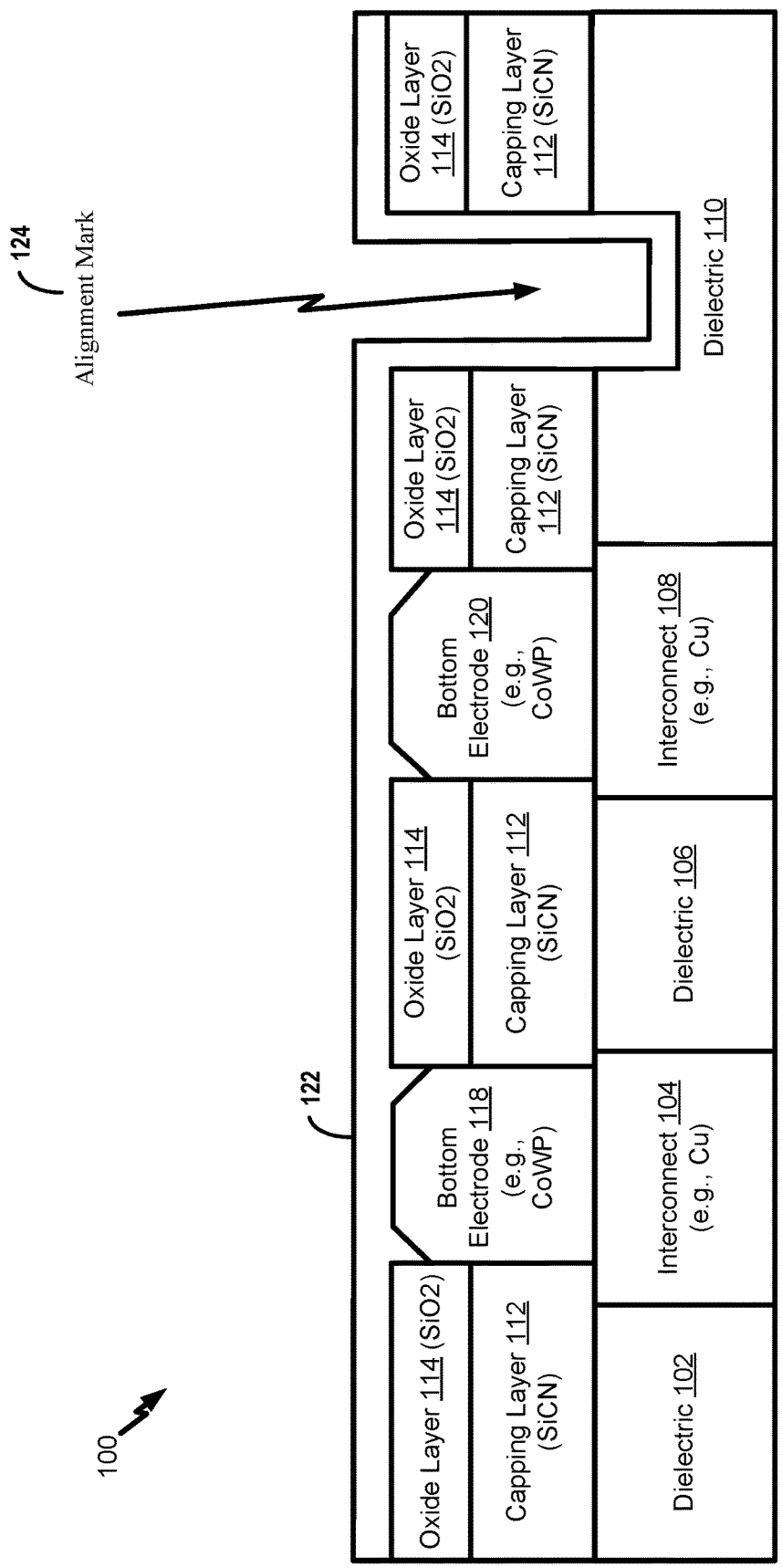
FIG. 1 is a diagram of a particular illustrative embodiment of a semiconductor device that includes a shallow bottom electrode structure for a resistive memory device.

Referring to FIG. 1, a particular illustrative embodiment of a semiconductor device 100 that includes a shallow bottom electrode structure for a resistive memory device is shown. FIG. 1 illustrates a cross-sectional view of a portion of the semiconductor device 100, and the components illustrated in FIG. 1 may be located in upper metal layers (e.g., a fifth metal layer (M5) or a sixth metal layer (M6)) of the semiconductor device 100. For example, transistors (not shown) and local interconnects may be present in lower metal layers (e.g., a first metal layer (M1)) of semiconductor device 100.

The semiconductor device 100 includes a first dielectric layer 102, a first interconnect layer 104, a second dielectric layer 106, a second interconnect layer 108, and a third dielectric layer 110. Each dielectric layer 102, 106, 110 may be comprised of silicon dioxide, carbon-doped silicon dioxide, porous silicon dioxide, porous carbon-doped silicon dioxide, or any combination thereof. The dielectric layers 102, 106, 110 may electrically isolate the interconnect layers 104, 108 from other components of the semiconductor device 100.

The first and second interconnect layers 104, 108 may be middle-of-the-line interconnect layers of the semiconductor device 100 or upper interconnect layers of the semiconductor device 100. For example, the first and second interconnect layers 104, 108 may be interconnects of the fifth metal layer (M5) of the semiconductor device 100 or interconnects of the sixth metal layer (M6) of the semiconductor device 100. In a particular embodiment, the first and second interconnect layers 104, 108 may be comprised of copper (Cu).

The semiconductor device 100 may also include a capping layer 112 and an oxide layer 114. In a particular embodiment, the capping layer 112 may be comprised of silicon nitricarbide (SiCN). The capping layer 112 may be on top of the dielectric layers 102, 106, 110. The capping layer 112 may improve (e.g., reduce) electro-migration. For example, electro-migration may cause voids and failures at the semiconductor device 100 due to the displacement of atoms based on current flowing through a conductor (e.g., the interconnect layers 104, 108). To suppress electro-migration, the capping layer 112 may be deposited on a portion of the semiconductor device 100 (e.g., the dielectric layers 102, 106, 110 and the interconnect layers 104, 108). The capping layer 112 may be optimized to improve electro-migration. However, the capping layer 112 may also cause defects at the semiconductor device 100 during chemical-mechanical planarization (CMP) processes. To circumvent the defects, the oxide layer 114 may be placed on top of the capping layer 112. In a particular embodiment, the oxide layer 114 may be comprised of silicon dioxide ($SiO_2$).

The semiconductor device 100 may also include a first bottom electrode 118 and a second bottom electrode 120. In a particular embodiment, the bottom electrodes 118, 120 may be comprised of cobalt tungsten phosphorus (CoWP). As described below, the bottom electrodes 118, 120 may be formed using an electroless deposition technique to reduce the effects of a chemical-mechanical planarization (CMP) process on the capping layer 112. The first bottom electrode 118 may be formed on the first interconnect layer 104, and the second bottom electrode 120 may be formed on the second interconnect layer 108.

Figure 2A:
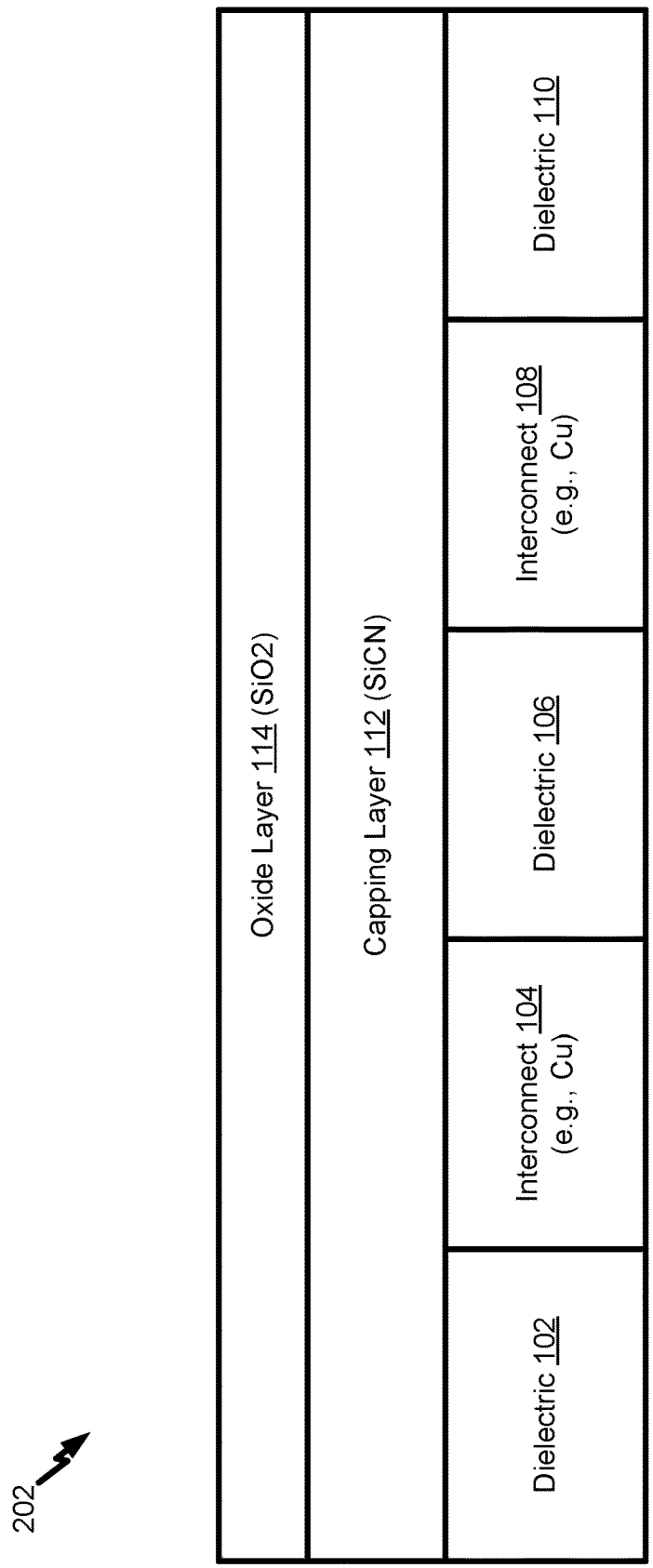
FIG. 2A illustrates a particular stage of forming the semiconductor device of FIG. 1.
Figure 2B:
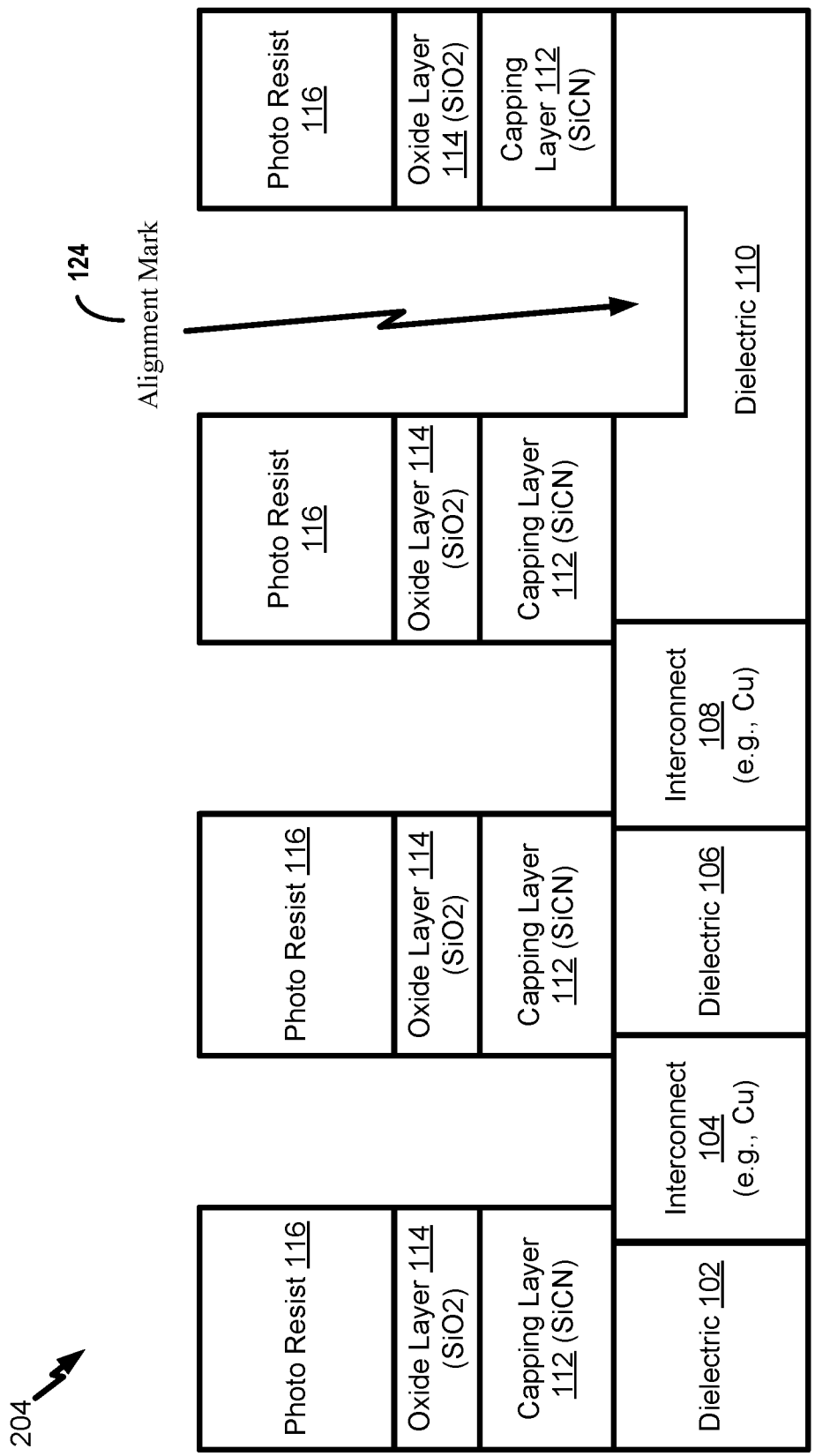
FIG. 2B illustrates another particular stage of forming the semiconductor device of FIG. 1.
Figure 2C:
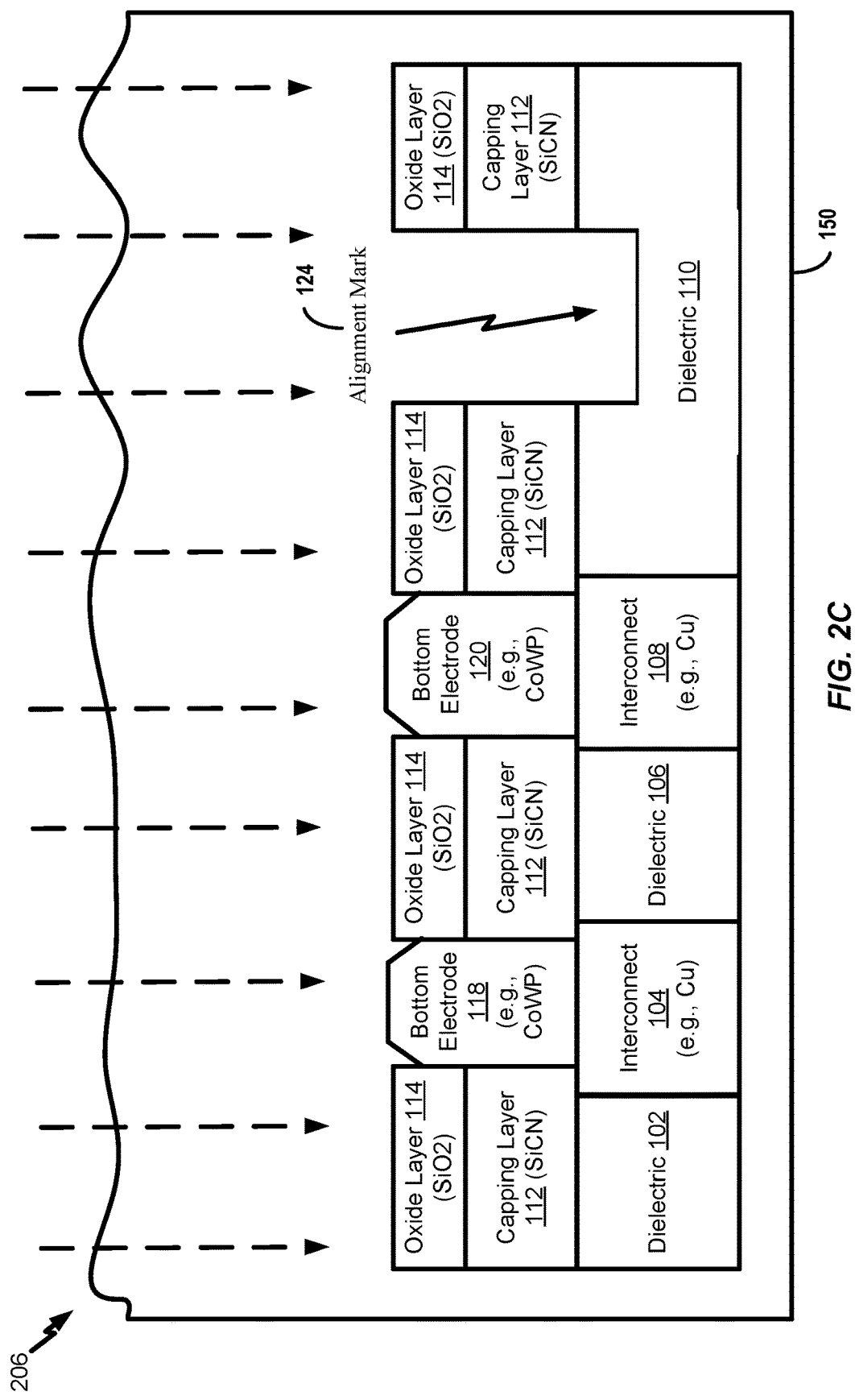
FIG. 2C illustrates another particular stage of forming the semiconductor device of FIG. 1.
Figure 2D:
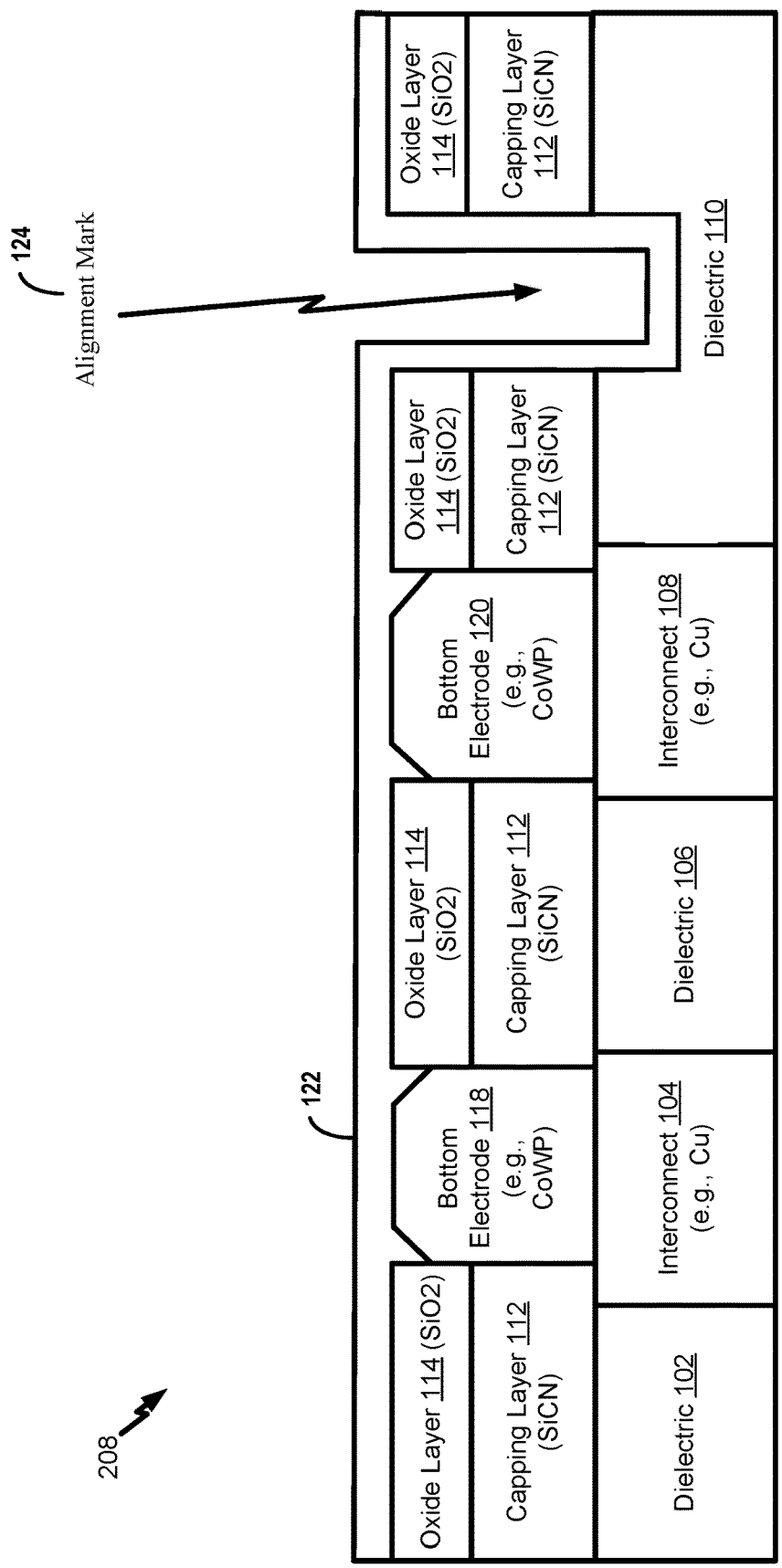
FIG. 2D illustrates another particular stage of forming the semiconductor device of FIG. 1.
Figure 2E:
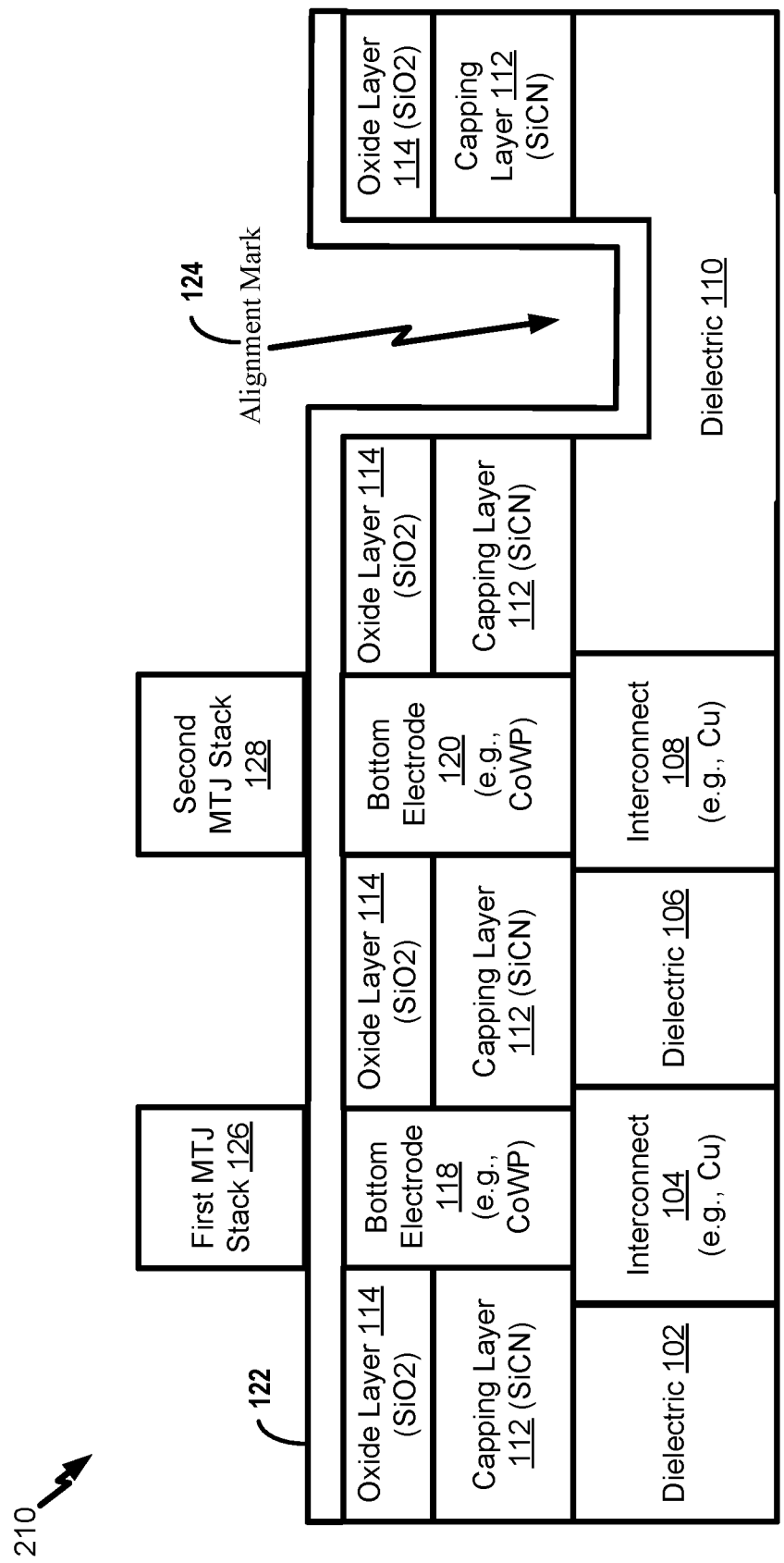
FIG. 2E illustrates another particular stage of forming the semiconductor device of FIG. 1.

Each bottom electrode 118, 120 may be a bottom electrode of a corresponding resistive memory component, as further described with respect to FIG. 2E. As a non-limiting example, the first bottom electrode 118 may be a bottom electrode of a first MTJ device (not shown), and the second bottom electrode 120 may be a bottom electrode of a second MTJ device (not shown). To illustrate, a first MTJ stack (not shown) may be deposited on top of the first bottom electrode 118 to form the first MTJ device, and a second MTJ stack (not shown) may be deposited on top of the second bottom electrode 120 to form the second MTJ device. The bottom electrodes 118, 120 may be relatively thin (e.g., between approximately 10-30 nm) compared to a conventional bottom electrode having a thickness of 50 nm or more. The relatively thin bottom electrodes 118, 120 may be used for sub-40 nm processes.

During electroless deposition, no current may pass through the semiconductor device 100 (e.g., the interconnect layers 104, 108). Rather, a chemical reaction may be used to form the bottom electrodes 118, 120. For example, masked portions of the semiconductor device 100 and the exposed interconnect layers 104, 108 (e.g., copper) may be "dipped" into an acid tank that includes cobalt ions, tungsten ions, and phosphorus ions. The ions may be deposited on the electrode (e.g., the interconnect layers 104, 108) to form the cobalt tungsten phosphorus (CoWP).

The semiconductor device 100 also includes an alignment mark 124 (e.g., a trench) that is etched into the third dielectric layer 106. The alignment mark 124 may be used to align the MTJ lithography with lower level patterns on the semiconductor device 100 (e.g., low level patterns on the wafer). For example, depositing MTJ stacks on the semiconductor device 100 (e.g., on the first bottom electrode 118 and on the second bottom electrode 120) may make alignment of the MTJ lithography with the lower level patterns of the semiconductor device 100 difficult. The alignment mark 124 may create topography to align the MTJ stacks with the lower level patterns on the semiconductor device 100.

A tantalum nitride (TaN) layer 122 may be deposited on top of the oxide layer 114, on top of the bottom electrodes 118, 120, and into the alignment mark 124 (e.g., the trench) to further planarize the surface of the semiconductor device 100 and form a good surface for depositing the most critical layers of the resistive memory device, for example, the ultra-thin layers of the magnetic tunnel junction. The tantalum nitride layer 122 may be deposited using ALD techniques or PVD techniques. The tantalum nitride layer 122 may undergo smoothing treatment, such as those based on a CMP process.

Because the semiconductor device 100 is dipped into the acid tank, the bottom electrodes 118, 120 may be formed upwards from the interconnect layers 104, 108 to fill vias. The upper surface of the bottom electrodes 118, 120 may be relatively level with the surface of the oxide layer 114 (e.g., the upper surface of the bottom electrodes 118, 120 may be relatively "smooth") as controlled by the acid bath time. To illustrate, a combined thickness of the capping layer 112 and the oxide layer 114 may be approximately equal to the thickness of the bottom electrodes 118, 120. Thus, the bottom electrodes 118, 120 may be formed without CMP or may reduce CMP process requirements.

Referring to FIG. 2A, a diagram illustrating a first stage 202 for forming the semiconductor device 100 of FIG. 1 is shown. At the first stage 202, the semiconductor device 100 may include the lower portion. For example, the semiconductor device may include the first dielectric layer 102, the first interconnect layer 104, the second dielectric layer 106, the second interconnect layer 108, and the third dielectric layer 110.

During the first stage 202, the capping layer 112 may be deposited on top of the lower portion using atomic layer deposition (ALD) techniques or physical vapor deposition (PVD) techniques. After the capping layer 112 is deposited on top of the lower portion, the oxide layer 114 may be deposited on top of the capping layer 112. For example, the oxide layer 114 may be deposited on the capping layer 112 using ALD techniques or PVD techniques.

Referring to FIG. 2B, a diagram illustrating a second stage 204 for forming the semiconductor device 100 of FIG. 1 is shown. At the second stage 204, a photo resist 116 may be deposited over select portions of the semiconductor device 100. For example, the photo resist 116 may be patterned above the first and second dielectric layers 102, 106. The photo resist 116 may also be patterned over a portion of the third dielectric layer 110 to create the alignment mark 124 during etching.

An etching process may be performed to expose the first and second interconnect layers 104, 108. For example, a buffered oxide etch, a wet etch, or a dry etch may be performed on the semiconductor device 100 to etch through portions of the oxide layer 114 and portions of the capping layer 112 above the interconnect layers 104, 108 (e.g., to form vias above the interconnect layers 104, 108). The etching process may also create the alignment mark 124. For example, the alignment mark 124 may be etched through the oxide layer 114, the capping layer 112, and a portion of the third dielectric layer 110. The photo resist 116 may be removed after the etching process is performed.

Referring to FIG. 2C, a diagram illustrating a third stage 206 for forming the semiconductor device 100 of FIG. 1 is shown. At the third stage 206, the semiconductor device 100 may be dipped into an acid tank 150 that includes cobalt ions, tungsten ions, and phosphorus ions. The ions may be deposited on the interconnect layers 104, 108 to form the bottom electrodes 118, 120 comprised of cobalt tungsten phosphorus (CoWP). In a particular embodiment, the Cu and W ions will selectively deposit on exposed metal surfaces over the first interconnect 104 and the second interconnect 108 by optimizing the chemistry of the acid bath. The oxide layer 114 may be comprised of silicon dioxide ($SiO_2$). Because the semiconductor device 100 is dipped into the acid tank 150, the bottom electrodes 118, 120 may be formed upwards from the interconnect layers 104, 108 to fill the vias. The upper surface of the bottom electrodes 118, 120 may be relatively level with the surface of the oxide layer 114 (e.g., the upper surface of the bottom electrodes 118, 120 may be relatively "smooth") when the semiconductor device 100 is removed from the acid tank 150. By use of the acid tank method, the bottom electrodes 118, 120 may be formed without performing CMP.

Referring to FIG. 2D, a diagram illustrating a fourth stage 208 for forming the semiconductor device 100 of FIG. 1 is shown. The fourth stage 208 may be implemented in some embodiments; however, in other embodiments, the fourth stage 208 may be bypassed. At the fourth stage 208, the tantalum nitride (TaN) layer 122 may be deposited on top of the oxide layer 114, on top of the bottom electrodes 118, 120, and into the alignment mark 124 (e.g., the trench). The tantalum nitride layer 122 may be deposited using ALD techniques or PVD techniques or other techniques. The tantalum nitride layer 122 may undergo smoothing treatment, for example those based on a CMP process.

Referring to FIG. 2E, a diagram illustrating a fifth stage 210 for forming the semiconductor device 100 of FIG. 1 is shown. At the fifth stage 210, remaining portions of resistive memory layers, for example, an MTJ stack, may be deposited on the semiconductor wafer. A photolithography step may be performed to create the appropriate device patterns. The photolithography step can align to underlining patterns on the semiconductor device 100 using the alignment mark 124. An etch step may be applied to transfer the resistive memory device pattern from photo resist to the resistive memory layers, for example, first MTJ device 126 may be formed on top of the first bottom electrode 118, and a second MTJ device 128 may be formed on top of the second bottom electrode 120. For example, the first MTJ stack 126 may include the first bottom electrode 118, a first seed layer (not shown), a first pinning layer (not shown), a first pinned layer (not shown), a first tunnel barrier layer (not shown), a first free layer (not shown), and a first top electrode (not shown). The second MTJ stack 128 may include the second bottom electrode 120, a second seed layer (not shown), a second pinning layer (not shown), a second pinned layer (not shown), a second tunnel barrier layer (not shown), a second free layer (not shown), and a second top electrode (not shown).

Although the remaining portions of the first and second MTJ stacks 126, 128 are depicted to be deposited on the first and second bottom electrodes 118, 120, respectively, in other embodiments, the remaining portions of the first and second MTJ stacks 126, 128 may be deposited on top of a tantalum nitride layer. For example, the remaining portions of the first and second MTJ stacks 126, 128 may deposited on top of the tantalum nitride layer 122 depicted in FIG. 2D.

In a particular embodiment, FIGS. 2A-2E illustrate steps of forming the semiconductor device 100 that includes a shallow electrode structure for a resistive memory device. One particular advantage provided by at least one of the disclosed embodiments is that by use of the acid tank method, the bottom electrodes 118, 120 may be formed without performing CMP. Another particular advantage provided by at least one of the disclosed embodiments is that the bottom electrodes 118, 120 may be relatively thin (e.g., between approximately 10-20 nm) compared to a conventional bottom electrode having a thickness of approximately 50 nm and above. Thus, the relatively thin bottom electrodes 118, 120 may be used for sub-14 nm processes. The techniques described with respect to FIGS. 2A-2E may also eliminate an additional mask level and associated processing step(s) to form surface topology alignment marks.

Figure 3:
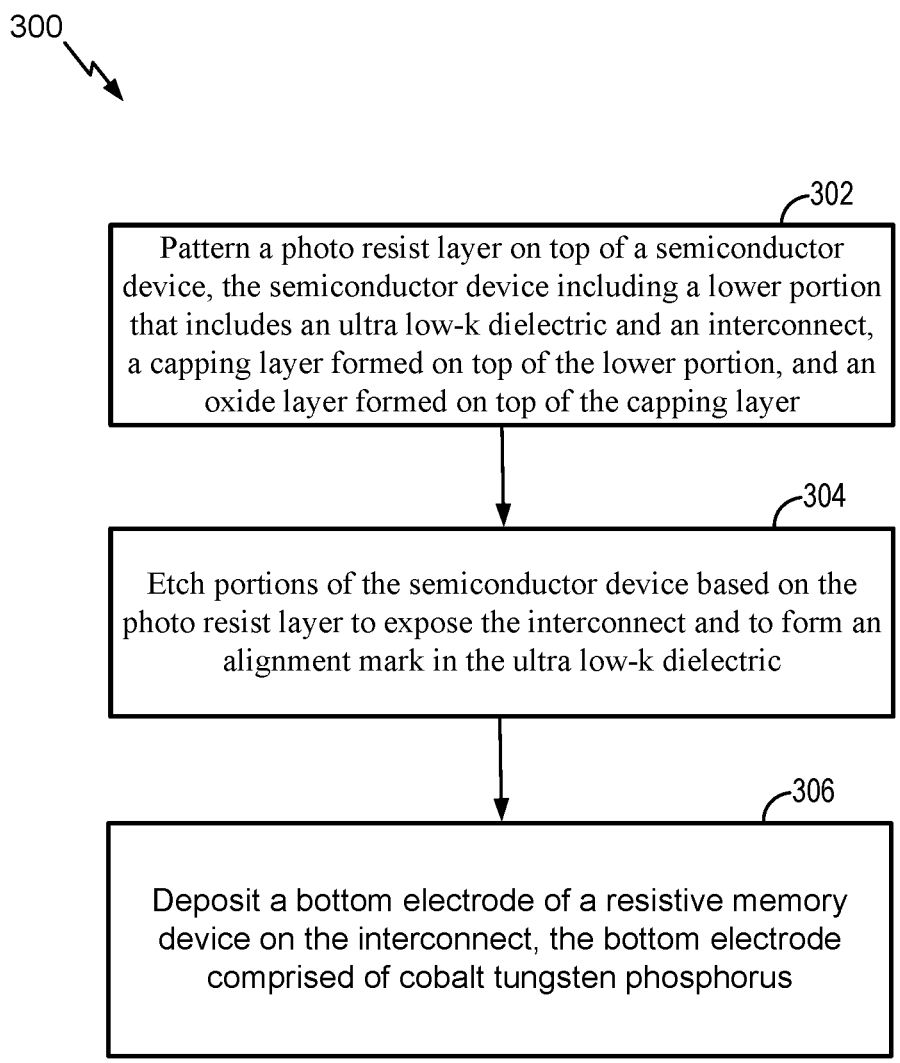
FIG. 3 is a flowchart of a particular illustrative embodiment of a method for forming a shallow bottom electrode structure for a resistive memory device.

Referring to FIG. 3, a flowchart of another particular illustrative embodiment of a method 300 for forming a shallow bottom electrode structure for a resistive memory device is shown. The method 300 may be performed using the manufacturing equipment described with respect to FIG. 5.

The method 300 includes patterning a photo resist layer on top of a semiconductor device, at 302. The semiconductor device may include a lower portion that includes a dielectric and an interconnect, a capping layer formed on top of the lower portion, and an oxide layer formed on top of the capping layer. For example, referring to FIG. 2B, the photo resist 116 may be patterned on top of the semiconductor device 100. To illustrate, the photo resist 116 may be patterned above the first and second dielectric layers 102, 106 and above a portion of the third dielectric layer 110.

Portions of the semiconductor device may be etched based on the photo resist layer to expose the interconnect and to form an alignment mark in the dielectric, at 304. For example, referring to FIG. 2B, the etching process may be performed to expose the first and second interconnect layers 104, 108. For example, a buffered oxide etch, a wet etch, or a dry etch may be performed on the semiconductor device 100 to etch through portions of the oxide layer 114 and portions of the capping layer 112 above the interconnect layers 104, 108 (e.g., to form vias above the interconnect layers 104, 108). The etching process may also create the alignment mark 124. For example, the alignment mark 124 may be etched through the oxide layer 114, the capping layer 112, and a portion of the third dielectric layer 110. The photo resist 116 may be removed after the etching process is performed.

A bottom electrode of a resistive memory device may be deposited on the interconnect, at 306. For example, referring to FIG. 2C, the semiconductor device 100 may be dipped into the acid tank 150 that includes cobalt ions, tungsten ions, and phosphorus ions. The ions may be deposited on the interconnect layers 104, 108 to form the bottom electrodes 118, 120 comprised of cobalt tungsten phosphorus (CoWP). In a particular embodiment, the portions of the semiconductor device 100 (other than the interconnect layers 104, 108) may be masked to reduce exposure to the ions. Because the semiconductor device 100 is dipped into the acid tank 150, the bottom electrodes 118, 120 may be formed upwards from the interconnect layers 104, 108 to fill the vias. Thus, the upper surface of the bottom electrodes 118, 120 may be relatively level with the surface of the oxide layer 114 (e.g., the upper surface of the bottom electrodes 118, 120 may be relatively "smooth") when the semiconductor device 100 is removed from the acid tank 150, which may reduce CMP process requirements. For example, the bottom electrodes 118, 120 may be formed without CMP.

The method 300 of FIG. 3 may use cobalt tungsten phosphorus (CoWP) to form the bottom electrodes 118, 120 on the interconnect layers 104, 108 via electroless deposition. By using electroless deposition to form the bottom electrodes 118, 120, the amount of current passed through the semiconductor device 100 (e.g., the interconnect layers 104, 108) is reduced. The method 300 may also reduce cost and process time for forming an alignment mark. For example, the alignment mark 124 may be patterned along with the vias (for the bottom electrodes 118, 120) when the photo resist 116 is applied to the semiconductor device 100. Thus, additional process steps and/or materials used in conventional techniques to form an alignment mark may be forgone.

Figure 4:
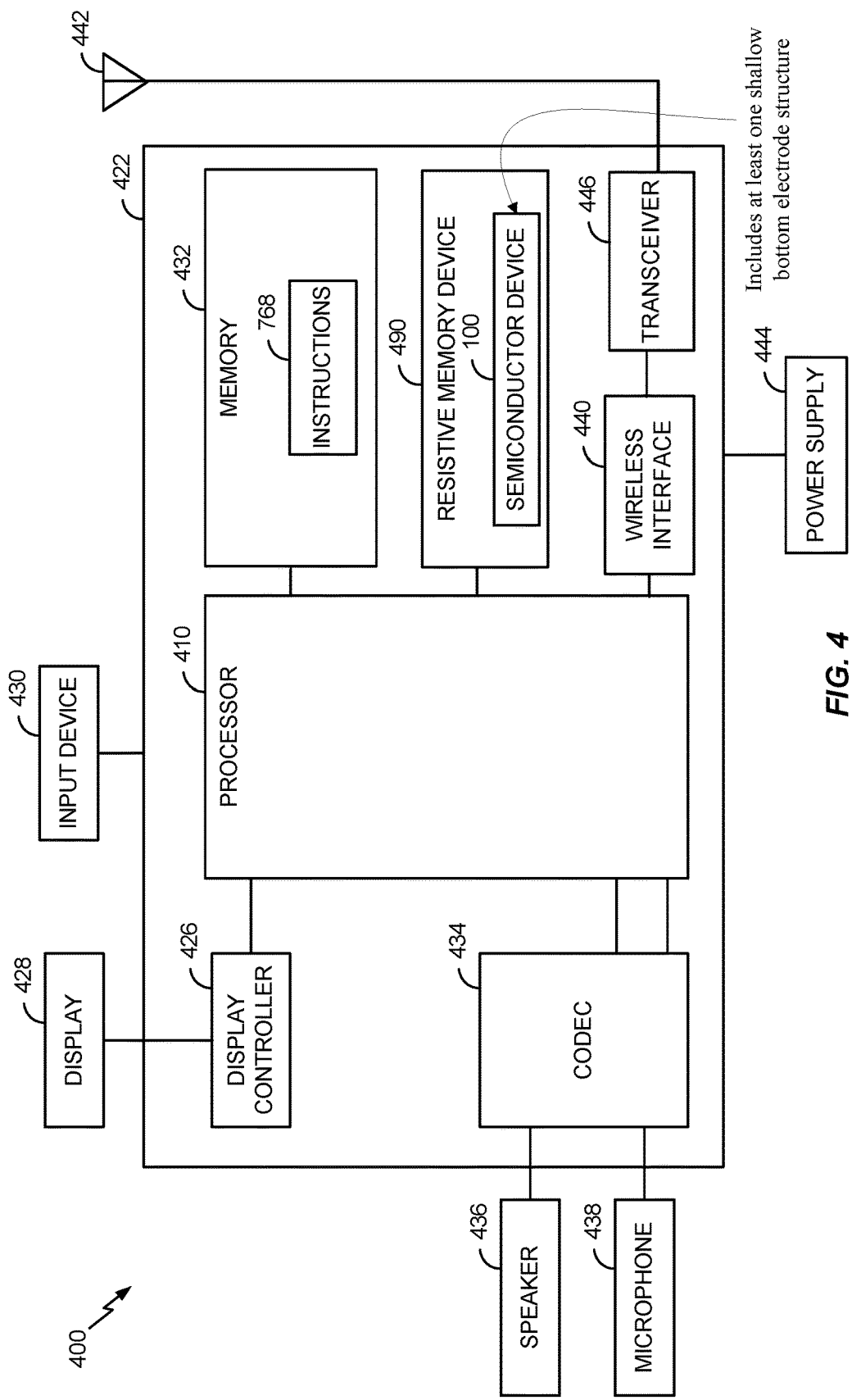
FIG. 4 is a block diagram of a device that includes a resistive memory having a shallow bottom electrode structure.

Referring to FIG. 4, a particular illustrative embodiment of a wireless communication device is depicted and generally designated 400. The device 400 includes a processor 410, such as a digital signal processor, coupled to a memory 432.

The processor 410 may be configured to execute software (e.g., a program of one or more instructions 468) stored in the memory 432. A resistive memory device 490 may be coupled to the processor 410. The resistive memory device 490 may include the semiconductor device 100 of FIG. 1. For example, the resistive memory device 490 may be a MRAM device or a RRAM device that includes a plurality of bottom electrodes comprised of cobalt tungsten phosphorus (CoWP) fabricated using electroless deposition.

A wireless interface 440 may be coupled to the processor 410 and to an antenna 442. A coder/decoder (CODEC) 434 can also be coupled to the processor 410. A speaker 436 and a microphone 438 can be coupled to the CODEC 434. A display controller 426 can be coupled to the processor 410 and to a display device 428. In a particular embodiment, the processor 410, the display controller 426, the memory 432, the CODEC 434, and the wireless interface 440 are included in a system-in-package or system-on-chip device 422. In a particular embodiment, an input device 430 and a power supply 444 are coupled to the system-on-chip device 422. Moreover, in a particular embodiment, as illustrated in FIG. 4, the display device 428, the input device 430, the speaker 436, the microphone 438, the antenna 442, and the power supply 444 are external to the system-on-chip device 422. However, each of the display device 428, the input device 430, the speaker 436, the microphone 438, the antenna 442, and the power supply 444 can be coupled to one or more components of the system-on-chip device 422, such as one or more interfaces or controllers.

Figure 5:
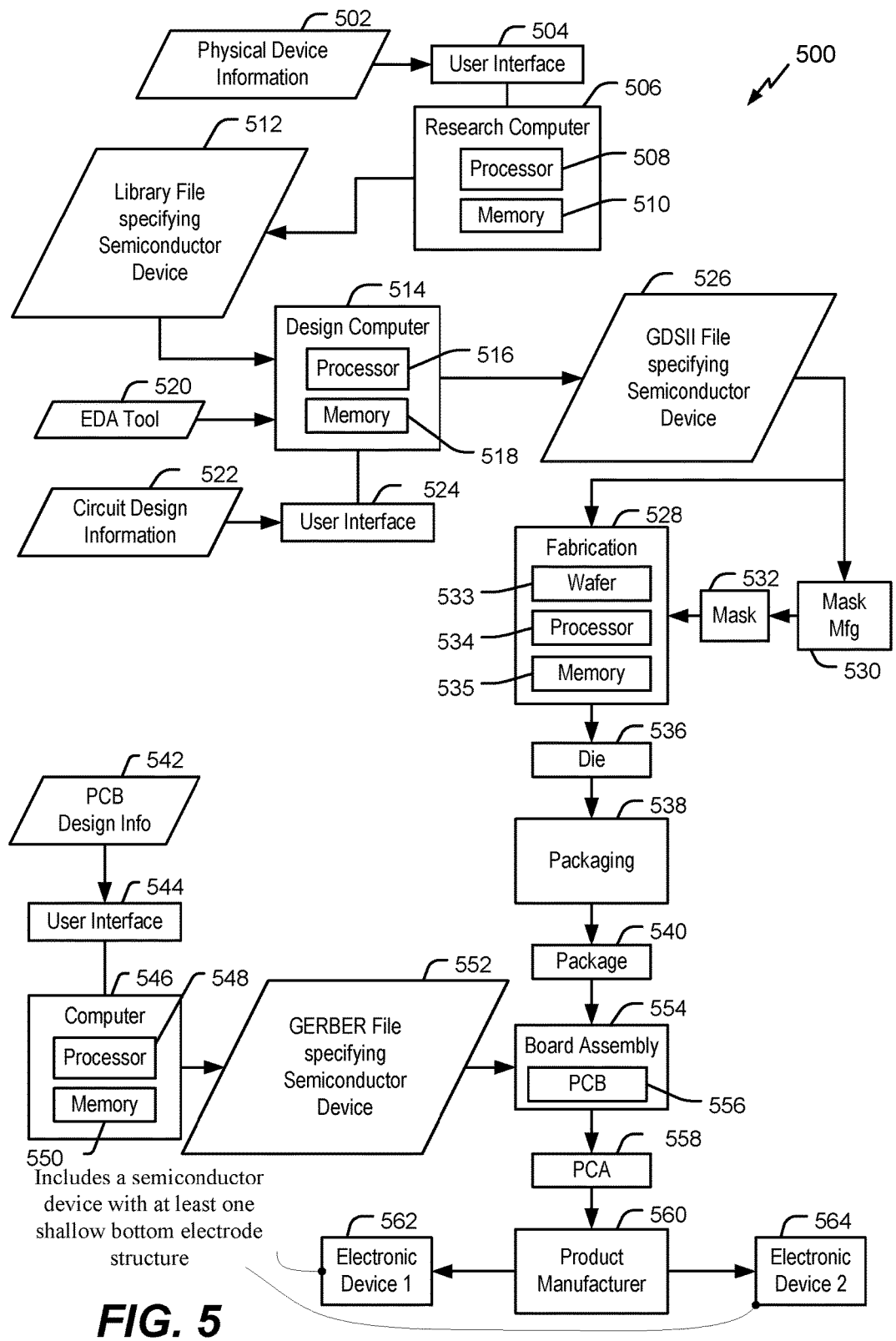
FIG. 5 is a data flow diagram of a particular illustrative embodiment of a manufacturing process to manufacture electronic devices that include a semiconductor device a shallow bottom electrode structure.

The foregoing disclosed devices and functionalities may be designed and configured into computer files (e.g., RTL, GDSII, GERBER, etc.) stored on computer-readable media. Some or all such files may be provided to fabrication handlers to fabricate devices based on such files. Resulting products include wafers that are then cut into dies and packaged into chips. The chips are then employed in devices described above. FIG. 5 depicts a particular illustrative embodiment of an electronic device manufacturing process 500.

Physical device information 502 is received at the manufacturing process 500, such as at a research computer 506. The physical device information 502 may include design information representing at least one physical property of a semiconductor device, such as a physical property of a semiconductor device described with reference to FIGS. 1-3. For example, the physical device information 502 may include physical parameters, material characteristics, and structure information that is entered via a user interface 504 coupled to the research computer 506. The research computer 506 includes a processor 508, such as one or more processing cores, coupled to a computer-readable medium such as a memory 510. The memory 510 may store computer-readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of semiconductor devices, including a semiconductor device described with reference to FIGS. 1-3, provided for use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable a user of the design computer 514 to design a circuit including a semiconductor device described with reference to FIGS. 1-3, using the library file 512. For example, a user of the design computer 514 may enter circuit design information 522 via a user interface 524 coupled to the design computer 514. The circuit design information 522 may include design information representing at least one physical property of a semiconductor device, such as a semiconductor device described with reference to FIGS. 1-3. To illustrate, the circuit design property may include identification of particular circuits and relationships to other elements in a circuit design, positioning information, feature size information, interconnection information, or other information representing a physical property of an electronic device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing a semiconductor device described with reference to FIGS. 1-3, in addition to other circuits or information. To illustrate, the data file may include information corresponding to a system-on-chip (SOC) or a chip interposer component that that includes a semiconductor device described with reference to FIGS. 1-3, and that also includes additional electronic circuits and components within the SOC.

The GDSII file 526 may be received at a fabrication process 528 to manufacture a semiconductor device described with reference to FIGS. 1-3 according to transformed information in the GDSII file 526. For example, a device manufacture process may include providing the GDSII file 526 to a mask manufacturer 530 to create one or more masks, such as masks to be used with photolithography processing, illustrated in FIG. 5 as a representative mask 532. The mask 532 may be used during the fabrication process to generate one or more wafers 533, which may be tested and separated into dies, such as a representative die 536. The die 536 includes a circuit including a semiconductor device described with reference to FIGS. 1-3.

In a particular embodiment, the fabrication process 528 may be initiated by or controlled by a processor 534. The processor 534 may access a memory 535 that includes executable instructions such as computer-readable instructions or processor-readable instructions. The executable instructions may include one or more instructions that are executable by a computer, such as the processor 534.

The fabrication process 528 may be implemented by a fabrication system that is fully automated or partially automated. For example, the fabrication process 528 may be automated and may perform processing steps according to a schedule. The fabrication system may include fabrication equipment (e.g., processing tools) to perform one or more operations to form an electronic device. For example, the fabrication equipment may be configured to perform one or more of the processes described with reference to FIGS. 2A-2E using integrated circuit manufacturing processes (e.g., wet etching, chemical vapor etching, dry etching, deposition, chemical vapor deposition, planarization, lithography, in-situ baking, or a combination thereof).

The fabrication system may have a distributed architecture (e.g., a hierarchy). For example, the fabrication system may include one or more processors, such as the processor 534, one or more memories, such as the memory 535, and/or controllers that are distributed according to the distributed architecture. The distributed architecture may include a high-level processor that controls or initiates operations of one or more low-level systems. For example, a high-level portion of the fabrication process 528 may include one or more processors, such as the processor 534, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component of the fabrication system may include a processor, such as the processor 534.

Alternatively, the processor 534 may be a part of a high-level system, subsystem, or component of the fabrication system. In another embodiment, the processor 534 includes distributed processing at various levels and components of a fabrication system.

The die 536 may be provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged electronic device on a circuit board, the packaged electronic device corresponding to the package 540 including a semiconductor device described with reference to FIGS. 1-3.

The computer 546 may be configured to transform the PCB design information 542 to generate a data file, such as a GERBER file 552 with data that includes physical positioning information of a packaged electronic device on a circuit board, as well as layout of electrical connections such as traces and vias, where the packaged electronic device corresponds to the package 540 including a semiconductor device described with reference to FIGS. 1-3. In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 558.

The PCA 558 may be received at a product manufacturer 560 and integrated into one or more electronic devices, such as a first representative electronic device 562 and a second representative electronic device 564. As an illustrative, non-limiting example, the first representative electronic device 562, the second representative electronic device 564, or both, may be selected from a set top box, a music player, a video player, an entertainment unit, a navigation device, a communications device, a personal digital assistant (PDA), a fixed location data unit, and a computer, into which a semiconductor device described with reference to FIGS. 1-3, is integrated. As another illustrative, non-limiting example, referring to FIG. 5, one or more of the electronic devices 562 and 564 may be a wireless communication device. As another illustrative, non-limiting example, one or more of the electronic devices 562 and 564 may also be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 5 illustrates remote units according to teachings of the disclosure, the disclosure is not limited to these illustrated units. Embodiments of the disclosure may be suitably employed in any device which includes active integrated circuitry including memory and on-chip circuitry.

A device that includes a semiconductor device described with reference to FIGS. 1-3, may be fabricated, processed, and incorporated into an electronic device, as described in the illustrative manufacturing process 500. One or more aspects of the embodiments disclosed with respect to FIGS. 1-6 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof. Although various representative stages are depicted with reference to FIGS. 1-6, in other embodiments fewer stages may be used or additional stages may be included. Similarly, the process 500 of FIG. 5 may be performed by a single entity or by one or more entities performing various stages of the manufacturing process 500.

In conjunction with the described aspects, an apparatus includes means for patterning a photo resist on top of a semiconductor device. The semiconductor device includes a power portion, a capping layer formed on top of the lower portion, and an oxide layer formed on top of the capping layer. The lower portion includes a dielectric layer and an interconnect layer. For example, the means for patterning the photo resist may include one or more components of the manufacturing equipment in FIG. 5.

The apparatus also includes means for etching portions of the semiconductor device based on the photo resist layer to expose the interconnect layer. For example, the means for etching portions of the semiconductor device may include one or more components of the manufacturing equipment in FIG. 5.

The apparatus also include means for depositing a bottom electrode of a resistive memory device on the interconnect layer. The bottom electrode is comprised of cobalt tungsten phosphorus (CoWP). For example, the means for depositing the bottom electrode may include the acid tank 150 of FIG. 2C and/or one or more components of the manufacturing equipment in FIG. 5.

Those of skill would further appreciate that the various illustrative logical blocks, configurations, modules, circuits, and algorithm steps described in connection with the embodiments disclosed herein may be implemented as electronic hardware, computer software, or combinations of both. Various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary non-transitory (e.g. tangible) storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   patterning a photo resist layer on top of a semiconductor device, the semiconductor device including a lower portion that includes a dielectric material and an interconnect, a capping layer formed on top of the lower portion and having a sidewall, and an oxide layer formed on top of the capping layer;
   etching portions of the semiconductor device based on the photo resist layer to expose the interconnect; and
   depositing an electrode of a resistive memory device on the interconnect, the electrode comprised of cobalt tungsten phosphorus (CoWP) and coupled to an overlying conductive barrier having a portion that overlaps the sidewall and that has a dimension greater than the electrode in a direction along the sidewall.

2. The method of claim 1, wherein the electrode is deposited on the interconnect using electroless deposition.

3. The method of claim 2, wherein depositing the electrode on the interconnect using electroless deposition comprises placing the semiconductor device into a tank of acid, the acid comprising cobalt ions, tungsten ions, and phosphorus ions.

4. The method of claim 1, further comprising etching portions of the semiconductor device to form an alignment mark in the dielectric material.

5. The method of claim 4, wherein the alignment mark extends through the oxide layer and the capping layer.

6. The method of claim 1, further comprising depositing the conductive barrier on the electrode and on the oxide layer to form a conductive barrier layer.

7. The method of claim 6, wherein the conductive barrier layer comprises a deposited layer of tantalum nitride (TaN).

8. The method of claim 6, wherein, after forming the conductive barrier layer, the conductive barrier layer includes a first portion that overlaps the electrode and the capping layer, wherein the conductive barrier layer includes a second portion that overlaps the sidewall, wherein the second portion is substantially perpendicular to the first portion, and wherein a dimension of the second portion is greater than a dimension of the electrode in a direction substantially perpendicular to a surface of the electrode that is adjacent to the conductive barrier layer.

9. The method of claim 1, further comprising depositing the conductive barrier along a sidewall of the oxide layer and along the sidewall of the capping layer.

10. The method of claim 9, further comprising planarizing the conductive barrier.

11. The method of claim 1, wherein the capping layer extends over the dielectric material.

12. The method of claim 1, wherein a combined thickness of the capping layer and the oxide layer is approximately equal to a thickness of the electrode.

13. The method of claim 1, wherein the semiconductor device is manufactured according to a sub-14 nanometer (nm) process.

14. The method of claim 1, wherein a thickness of the electrode is between approximately 10 nanometers (nm) and 30 nm.

15. The method of claim 1, wherein the interconnect is included in a metal layer of the semiconductor device.

16. The method of claim 1, wherein the resistive memory device comprises a magnetic tunnel junction (MTJ) element.

17. The method of claim 1, wherein the capping layer is comprised of silicon nitricarbide (SiCN), and wherein the oxide layer is comprised of silicon dioxide ($SiO_2$).

18. A non-transitory computer-readable medium comprising instructions that, when executed by a processor, cause the processor to:
   initiate patterning a photo resist layer on top of a semiconductor device, the semiconductor device including a lower portion that includes a dielectric material and an interconnect, a capping layer formed on top of the lower portion and having a sidewall, and an oxide layer formed on top of the capping layer;
   initiate etching of portions of the semiconductor device based on the photo resist layer to expose the interconnect; and
   initiate deposition of an electrode of a resistive memory device on the interconnect, the electrode comprised of cobalt tungsten phosphorus (CoWP) and coupled to an overlying conductive barrier having a portion overlapping the sidewall with a dimension greater than the electrode in a direction along the sidewall.

19. The non-transitory computer-readable medium of claim 18, wherein the instructions, when executed by the processor, further cause the processor to initiate etching portions of the semiconductor device to form an alignment mark in the dielectric material.

20. The non-transitory computer-readable medium of claim 18, wherein the instructions, when executed by the processor, further cause the processor to initiate deposition of the conductive barrier on the electrode, on the oxide layer, along a side surface of the oxide layer, and along the sidewall of the capping layer.

21. An apparatus comprising:
   means for patterning a photo resist layer on top of a semiconductor device, the semiconductor device including a lower portion that includes a dielectric material and an interconnect, a capping layer formed on top of the lower portion and having a sidewall, and an oxide layer formed on top of the capping layer;
   means for etching portions of the semiconductor device based on the photo resist layer to expose the interconnect; and
   means for depositing an electrode of a resistive memory device on the interconnect, the electrode comprised of cobalt tungsten phosphorus (CoWP) and coupled to an overlying conductive barrier having a portion overlapping the sidewall with a dimension greater than the electrode in a direction along the sidewall.

22. The apparatus of claim 21, wherein the means for depositing is configured to deposit the electrode using electroless deposition.

23. The apparatus of claim 21, wherein the interconnect and the electrode are manufactured according to a sub-14 nanometer (nm) process.

24. The apparatus of claim 21, wherein a thickness of the electrode is between approximately 10 nanometers (nm) and 30 nm.

25. The apparatus of claim 21, wherein the interconnect is included in a metal layer of the semiconductor device.

26. The apparatus of claim 21, wherein the resistive memory device comprises a magnetic tunnel junction (MTJ) element.

27. The apparatus of claim 21, further comprising means for depositing the conductive barrier on the electrode, on the oxide layer, along a side surface of the oxide layer, and along the sidewall of the capping layer.

28. An apparatus comprising:
 means for interconnecting metal structures of a semiconductor device;
 means for separating the semiconductor device and a resistive memory device, wherein the means for separating is conductive;
 means for reducing electro-migration from the means for interconnecting, the means for reducing electro-migration disposed between the means for interconnecting and the means for separating; and
 means for conducting current interposed between the means for interconnecting and the means for separating, wherein the resistive memory device comprises the means for conducting, wherein the means for conducting is comprised of cobalt tungsten phosphorus (CoWP), wherein the means for separating includes a first portion that overlaps the means for conducting and the means for reducing electro-migration, wherein the means for conducting includes a second portion that overlaps a side surface of the means for reducing electro-migration, and wherein a dimension of the second portion is greater than a dimension of the means for conducting in a direction along the side surface.

29. The apparatus of claim 28, wherein the means for separating comprises tantalum nitride (TaN), wherein the means for reducing electro-migration is comprised of silicon nitricarbide (SiCN), and wherein a particular dimension of the second portion is greater than a particular dimension of the means for conducting in a direction substantially perpendicular to a surface of the means for conducting that is adjacent to the means for separating.

30. The apparatus of claim 28, wherein a surface of the second portion is substantially perpendicular to a surface of the first portion, and wherein the means for interconnecting, the means for separating, the means for reducing electro-migration, and the means for conducting are integrated in a mobile device.

* * * * *